United States Patent [19]

Wakalopulos

[11] Patent Number: 5,612,588
[45] Date of Patent: Mar. 18, 1997

[54] ELECTRON BEAM DEVICE WITH SINGLE CRYSTAL WINDOW AND EXPANSION-MATCHED ANODE

[75] Inventor: George Wakalopulos, Pacific Palisades, Calif.

[73] Assignee: American International Technologies, Inc., Torrance, Calif.

[21] Appl. No.: 369,127

[22] Filed: Jan. 5, 1995

Related U.S. Application Data

[63] Continuation-in-part of Ser. No. 68,052, May 26, 1993, Pat. No. 5,414,267.

[51] Int. Cl.$^6$ ...................................................... H01J 33/00
[52] U.S. Cl. ............................ 313/420; 313/35; 313/46; 361/161
[58] Field of Search ...................... 313/420, 446, 313/447, 448, 456, 458, 495, 306, 308, 312, 317, 325, 35, 103 CM, 105 CM, 44, 45, 46, 42, 22; 250/492.3, 493.1; 361/161

[56] References Cited

U.S. PATENT DOCUMENTS

| | | | |
|---|---|---|---|
| 3,319,318 | 5/1967 | Taimuty | 313/420 X |
| 3,486,060 | 12/1969 | Swanson | 313/74 |
| 3,562,793 | 2/1971 | McCann et al. | 313/36 |
| 3,607,680 | 9/1971 | Uno et al. | 313/420 X |
| 3,629,576 | 12/1971 | Enge | 250/49.5 C |
| 3,702,973 | 11/1972 | Daugherty et al. | 331/94.5 PE |
| 3,878,417 | 4/1975 | Eberlein | 313/59 |
| 3,883,413 | 5/1975 | Douglas-Hamilton | 204/176 |
| 4,061,944 | 12/1977 | Gay | 313/420 |
| 4,095,115 | 6/1978 | Orr, Jr. et al. | 250/538 |
| 4,362,965 | 12/1982 | Kendall | 313/420 |
| 4,409,511 | 10/1983 | Loda et al. | 313/34 |
| 4,455,561 | 6/1984 | Boyden et al. | 346/140 R |
| 4,468,282 | 8/1984 | Neukermans | 156/633 |
| 4,764,947 | 8/1988 | Lesensky | 378/138 |
| 4,825,123 | 4/1989 | Franzel et al. | 313/452 |
| 5,093,602 | 3/1992 | Kelly | 313/231.01 |
| 5,210,426 | 5/1993 | Itoh et al. | 250/492.3 |
| 5,235,239 | 8/1993 | Jacob et al. | 313/363.1 |
| 5,391,958 | 2/1995 | Kelly | 313/420 |

*Primary Examiner*—Sandra L. O'Shea
*Assistant Examiner*—Ashok Patel
*Attorney, Agent, or Firm*—Thomas Schneck

[57] ABSTRACT

A vacuum tube electron beam device having a thin, single crystal, electron permeable, gas impermeable membrane for electron transmission and methods for making such a device. Single crystal membranes can have small thickness due to high strength, are highly transmissive to free electrons due to that small thickness. The ordered crystalline structure of such membranes provides minimal obstructions to electron beams, and yet is highly impermeable to penetration by gas and liquid molecules. Single crystals are anisotropically etched to precise membrane dimensions, and can also be etched to provide microchannel structures for flowing cooling fluid across the membrane during use. A doped silicon anode can provide support for the membrane with matching thermal expansion characteristics, and a crystalline anode can be integral with the membrane. A double membrane embodiment confines the cooling fluid so that it passes close to both membranes. A double membrane structure can also have a pressure between the membranes that is between the pressure within the vacuum tube and ambient pressure outside the vacuum tube, allowing the membranes to be thinner. The membrane can also be compressed for increased strength. A number of cooling methods are used to maintain the integrity of the membrane.

37 Claims, 3 Drawing Sheets

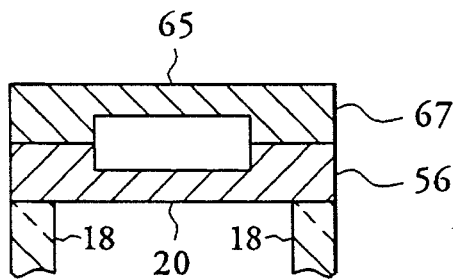
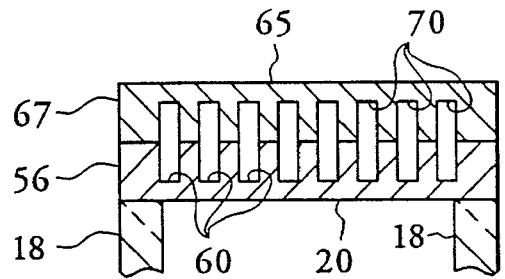
FIG. 7A  FIG. 7B
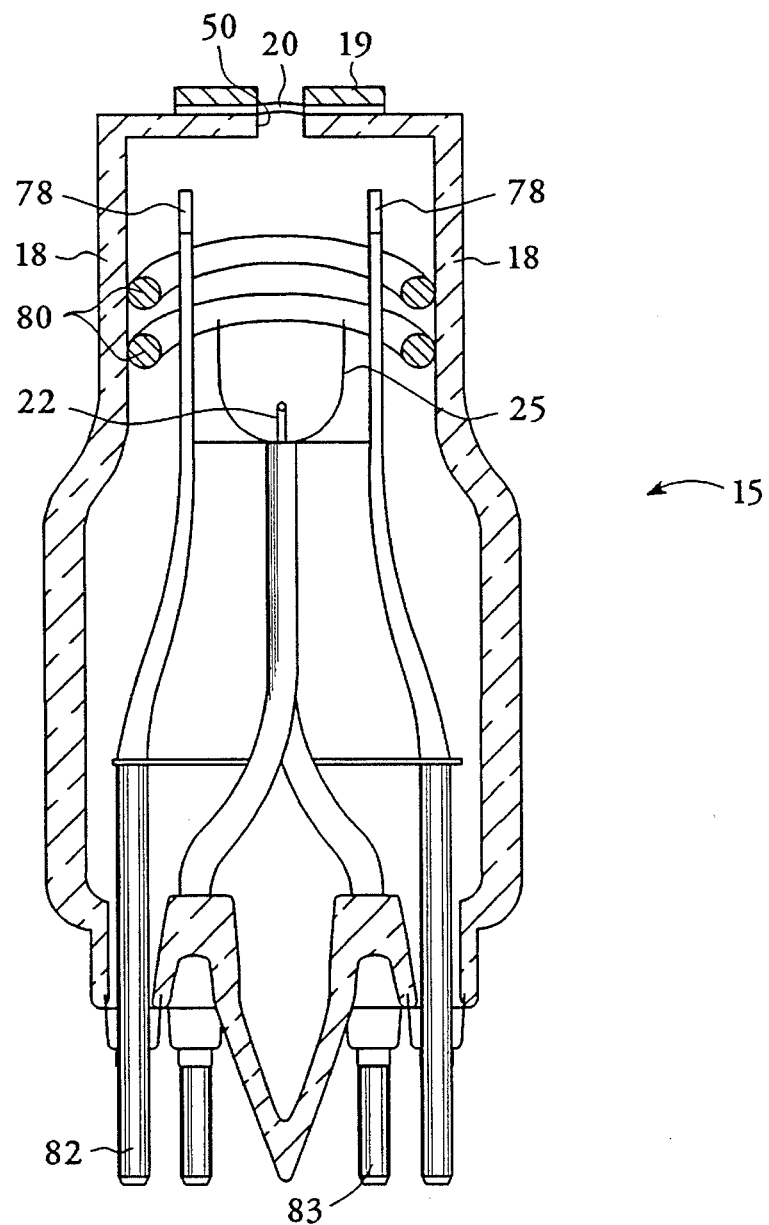
FIG. 8

ELECTRON BEAM DEVICE WITH SINGLE CRYSTAL WINDOW AND EXPANSION-MATCHED ANODE

CROSS REFERENCE TO RELATED APPLICATION

This is a continuation-in-part of prior application Ser. No. 08/068,052 filed May 26, 1993.

TECHNICAL FIELD

The present invention relates to an electron beam tube having an improved window and anode.

BACKGROUND ART

Vacuum tubes for generating electron beams have long been known, as the generation and acceleration of free electrons is favorably accomplished in a low pressure environment. For example, devices such as television picture tubes use accelerated electrons to excite points on a phosphorescent screen which thereafter irradiate light for viewing.

In order for electron beams to be produced in a vacuum tube for use outside the low pressure environment of the tube, windows have been developed which allow electrons to exit the tube but keep gases at ambient pressure from entering. Since a beam of electrons penetrating such a window can result in heating that destroys the window, means of cooling such windows have also been developed.

In U.S. Pat. No. 3,486,060, Swanson teaches the use of a number of angled orifices for directing laminar flow of cooling gases across a metal window. U.S. Pat. No. 3,562,793 to McCann et al. also teaches the use of laminar gas flow to externally cool metal windows for charged particles.

U.S. Pat. No. 3,629,576 to Enge describes a focussing electrode for use in an accelerator tube, the electrode generally shaped as a plate having a central aperture through which charged particles pass and a symmetric variation of indentations encircling that aperture.

In U.S. Pat. No. 3,702,973, Daugherty et al. describe a laser or ozone generator in which electrons generated by emission from filaments are accelerated to a plate held at positive potential, the plate having a plurality of holes that allow some electrons to pass through, the holes covered with a metal diaphragm through which some electrons penetrate to reach a gas such as oxygen. U.S. Pat. No. 3,883,413 to Douglas-Hamilton discloses the use of such a device with pulsed electron beams and decaying electric fields. In U.S. Pat. No. 4,095,115, Orr, Jr. et al. disclose a hollow cathode plasma discharge device utilizing a metal window and adjacent high velocity oxygen gas for producing ozone.

U.S. Pat. No. 4,409,511 to Loda et al. describes a phase transition cooling system for charged particle accelerators, the cooling system involving directing atomized, vaporizable liquid at charged particle windows made of metal or plastic. In U.S. Pat. No. 4,468,282, Neukermans teaches a method of making amorphous thin film windows for use with ink jet printers.

In U.S. Pat. No. 4,764,947, Lesensky teaches a cathode focussing arrangement for production of x-rays by electrons impinging upon a metal anode. U.S. Pat. No. 4,825,123 to Franzel et al. discloses a method for making x-ray tubes wherein a cathode cup is manufactured in two pieces to minimize damage to the cathode or filament.

U.S. Pat. No. 5,093,602 to Kelly teaches of a device for atomizing a stream of fluent material which can use an electron beam directed through an electron permeable membrane formed of amorphous boron-nitride to facilitate dispersion of a liquid. In U.S. Pat. No. 5,210,426, Itoh et al. teach of an electron beam device including an electron permeable window formed of a Ti-Al composite. Finally, U.S. Pat. No. 5,235,239 to Jacob et al. teaches of various foil window constructions for a particle accelerator.

A number of applications for which low voltage electron beams are particularly desirable creates a desire for further improvements in this area.

SUMMARY OF THE INVENTION

The present invention employs single crystal membranes for electron permeable, gas impermeable windows and also employs matching crystalline anodes in electron beam devices. As the cooling needs of such crystalline membranes differ from those of the metal foil membranes typical in the prior art, novel cooling devices are also disclosed.

The orderly crystal lattice of single crystal membranes permits electrons to more easily penetrate the membranes than prior art windows made of polycrystalline or amorphous materials, allowing a lower voltage to be applied and lower energy electrons to be produced. At the same time, the orderly crystal lattice of such membranes better prevents molecules of gases or liquids from penetrating the membranes. The strength of single crystals is also superlative, allowing membranes formed of such materials to be made thinner, allowing even greater electron transparency. Such single crystals can also be formed of elements having a relatively low atomic number, which reduces scattering of electrons traversing the membrane. The use of single crystal membranes for electron windows in beam generating devices thus has a combination of attributes not found in other types of windows.

Employment of crystalline anodes for electron beam devices also has a number of advantages. As above, single crystals offer superior strength, and crystals such as silicon can be anodically bonded to glass, so that a crystalline anode can provide a convenient and strong front end to a glass vacuum tube. Semiconductor processing techniques can be used to shape such an anode, so that, in one embodiment, single crystal windows can be formed simply at etched portions of the anode. On the other hand, where a window is separately formed from the anode, the anode and window materials can be selected to have matching coefficients of thermal expansion.

The present invention also involves methods for making electron beam generating devices with single crystal membranes and anodes. In one embodiment of the invention, a single crystal membrane is fashioned by selectively etching a single crystal substrate such as a silicon wafer to leave a window of desired dimensions. In another embodiment, a single crystal membrane is grown on a crystalline substrate having a matching lattice constant which promotes single crystal growth, after which the portion of the substrate obstructing the window is etched away. In either of these embodiments the remaining substrate can serve as a means for attachment of the membrane to the remainder of the vacuum tube device, and can also serve as the anode. Also, the substrate surrounding the membrane can be etched to form channels for directing cooling fluid across an outer surface of the membrane. Similar channels can extend across the membrane, creating an array of extremely thin windows, separated by supporting ridges of the same material, which allows the production of very low energy electron beams. Thus, for example, a single silicon wafer can be machined to provide an integral front end, anode, window, cooling and support structure for a vacuum tube.

Cooling of the membrane can be accomplished with a variety of techniques. A heat exchanging fluid can be flowed past the outer surface of the membrane in a variety of patterns to transport heat away from the membrane. The fluid can be chosen to have a boiling point at a temperature and pressure common to that of the membrane during use, so that heat is absorbed from the membrane by vaporizing the fluid. A second electron permeable membrane can be positioned nearby to confine the flow of fluid to areas near to the membranes, thereby cooling both membranes. An array of microchannels can be formed next to the outer surface of the membrane to direct jets of cooling fluid across the outer surface to rapidly transport heat from the membrane. The relatively small thickness and high heat conductivity of the membrane allows cooling of the outer surface to quickly cool the entire membrane.

The low energy electrons that can be produced by a beam generating device with such an electron transparent window have a number of useful applications. Cross linking or incision of polymers can be advantageously performed by a beam having a large number of low energy electrons. Certain imaging applications can also be performed favorably with low energy electrons. Generation of volatile gases such as ozone is also possible using devices of the present invention, as is atomization of liquids.

BRIEF DESCRIPTION OF THE DRAWINGS

FIG. 7A is a cross-sectional side view of a pair of single crystal membranes.

FIG. 7B is a cross-sectional side view of microchannels adjacent to the membranes of FIG. 7A.

FIG. 8 is a side view of an electron beam device including focusing elements and a single crystal membrane bowed outward prior to evacuation.

BEST MODE FOR CARRYING OUT THE INVENTION

Figures 1, 2:
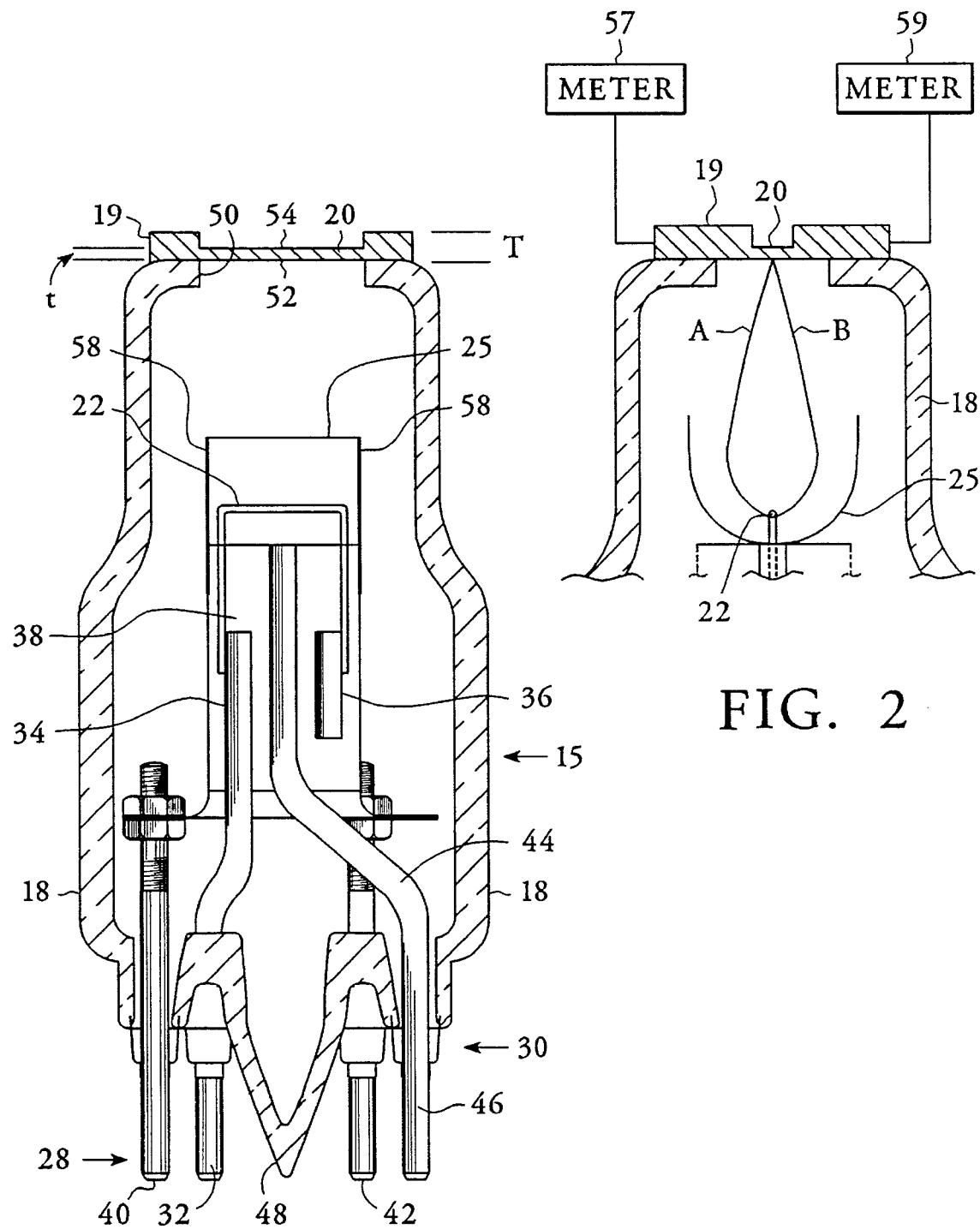
FIG. 1 is a cutaway side view of an electron beam device of the present invention.
FIG. 2 is a cutaway side view of a top portion of the device of FIG. 1, oriented normally to the view of FIG. 1.

Referring to FIG. 1, an electron beam device 15 is seen to have a vacuum tube wall 18, which may have a variety of shapes, and is capped by a substrate 19 having a thin, single crystal, electron permeable, gas impermeable membrane 20 at its center. Centered within the tube wall 18 is an elongated thermionic filament 22 which is surrounded by a cathode 25, except for an opening of the cathode 25 facing toward the membrane 20. The filament 22 and the cathode 25 are maintained at a highly negative potential, which may range from −10 to −200 kilovolts (kV), relative to the electrical potential of the window, which is near ground potential. The substrate 19, which may be made of an n-type silicon wafer, may serve as an anode attracting electrons from the filament 22.

A number of tube pins 28 penetrate a back end 30 of the device 15 to provide mechanical support and electrical connections for the filament 22 and the cathode 25, while maintaining a gas tight chamber within the device 15. A filament pin 32 and a second hidden pin are connected to the body by means of a metal-to-glass seal or feed-through carrying electrodes 34 and 36, which are connected within electrically insulative block 38 to filament 22, in order to generate electrons by thermionic emission. Support pins 40 and 42 provide support for block 38 which in turn supports cathode 25. Cathode 25 is provided with an electrical potential at least as negative as that of the filament 22, in order to accelerate electrons generated at the filament 22 toward the membrane 20. Wire 44 provides this negative electrical potential to cathode 25 via a connection not shown in this figure, wire 44 being connected to cathode pin 46 which protrudes from the back end 30 of the device 15. The device 15 can be pumped down to a low pressure, such as $10^{-4}$ Torr, after which a glass seal 48 is affixed at the back end 30.

The membrane 20 is seated atop an opening 50 in the wall 18. Although not shown to scale in this figure, the wall 18, which is typically made of glass, is many times thicker than the membrane 20, which may be less than 1 to at least 50 microns in thickness, t. Surrounding the membrane is a substrate 19 which has an inner surface that is coplanar with the inner surface 52 of the membrane 20, but which extends beyond the outer surface 54 of the membrane for strength and attachment to the wall 18. The substrate 19 may have a thickness t which is in a range between 1 mm and greater than 1 cm. The membrane thickness t is minimized in order to allow even low energy electrons impinging upon an inner surface 52 of the membrane 20 to penetrate the membrane 20 relatively unperturbed and emerge from an outer surface 54 with energy and momentum characteristics that are easily predicted and manipulated from voltages and currents provided to the cathode 25 and filament 22. The thickness t, however, cannot be made so small that at pressure differences and temperatures commonly experienced by the membrane 20, stresses applied to the membrane 20 exceed the strength of the material forming the membrane 20. For this reason, the strength of the material forming the membrane 20 should be optimized.

It has been found that membranes 20 formed of single crystals are of high strength and additionally allow electrons to penetrate relatively unperturbed due to the ordered atomic arrangement of the crystal lattice of the membranes 20. To a first approximation, the main obstacles encountered by electrons traveling through matter are the nuclei of the atoms that form the matter. In single crystals, these nuclei are arranged in a lattice that can be thought of approximately as an array of points aligned on a series of lines. By the same token, a series of pathways exist that are free of these lines of obstacles. Electrons traveling in trajectories aligned with these pathways have a high probability of penetrating thin membranes. The interaction of the atomic nuclei opposing electron penetration increases with increasing atomic number, and thus it is preferable for membranes 20 to be formed of low atomic number atoms. Fortunately, some of the hardest materials known, such as diamond, have generally low atomic numbers of approximately twelve. These materials also have the favorable characteristics of behaving generally as electrical insulators but heat conductors.

Additionally, single crystal membranes 20 have the advantage of being impervious to gas flow. Gas molecules, which may be one thousand or more times larger than electrons, are too large to penetrate the framework of a single crystal lattice. This is in contrast to membranes made of polycrystalline materials, in which defects in the crystal structure may allow gas molecules to wind through the membranes. Such defects also tend to propagate during use, promoting failure of the membranes. Amorphous materials such as metals and glasses also may allow penetration by some gas molecules, which is one reason why the glass wall 18 must be made thicker than the membrane 20.

In general, single crystal membranes 20 of the present invention are formed of group IV materials, such as diamond (C), single crystal silicon (Si) or single crystal germanium (Ge). Some of these materials are commercially available as substrates 19 which can be etched to form single crystal membranes 20 of desired dimensions. Other desired materials can be created by epitaxially growing compounds that are lattice matched to commercially available, single crystal substrates, as is known in the art of semiconductor processing. For defect-free single crystal growth of a membrane 20 to a thickness t that is preferable for a gas impermeable, electron permeable window of the present invention, a lattice constant of the membrane 20 material should match that of the substrate to within one tenth of one percent. The substrates 19 can then be etched away, leaving the single crystal membrane 20 formed of the desired material.

Single crystal materials such as single crystal silicon can be anisotropically etched as is known in the art of semiconductor processing to exact dimensions. Etching the substrate 19 can be performed to leave a thicker section of substrate 19 around the membrane 20 for attachment to the glass wall 18 and for added strength. The thickness of the membrane 20 can be precisely controlled by implanting an etch stop layer that will remain after selective etching of the substrate. The etch stop layer also provides a means for tensioning or compressing the membrane 20, as implanted ions in that layer may replace atoms of the crystal lattice having a different bond length. Additionally, the substrate 19 can be etched to create a channel or channels that are used during operation to guide fluid across the outer surface 54 of the membrane 20 for cooling. Alternatively, a substrate can be etched to create an array of thin windows separated by thicker ribs. The strength provided by the ribs allows the windows to be thinner, allowing penetration by lower energy electrons.

Referring now to FIG. 2, cathode 25 is seen to have generally parabolic cross-section in this view (as compared to the generally rectangular appearance seen in the perpendicularly oriented view of FIG. 1) arching away from the block 38 and around the filament 22 like petals of a tulip flower, to focus electrons in a generally stripe-shaped pattern at the membrane 20. Curves A and B represent two possible trajectories of electrons emitted from filament 22 and accelerated by an electric field between the negative voltage of the cathode 25 and the ground voltage of the membrane 20. Cathode 25 may have end walls 58, shown in FIG. 1, which act to focus electrons within the length of the stripe-shaped pattern at the membrane 20.

The substrate 19, which may be made of doped silicon similar to that commonly used in semiconductor wafers, is connected to ammeters 57 and 59, which measure a current of electrons blocked by the substrate 19. Due to the relative thinness of the membrane 20 compared to the substrate 19, a much greater percentage of electrons impinging on the substrate 19 as compared to those impinging upon the membrane 20 provide current to the ammeters 57 and 59, providing a measurement of how accurately electrons are focused on the membrane 20. The relative thinness of the membrane 20 as compared to the substrate 19 also causes the membrane 20 to act as a resistive barrier to current flow, so that the current in ammeter 57 can be compared with the current in ammeter 59 to yield a measurement of which side of the substrate 19 more electrons are impinging upon, allowing the electron beam to be focused accordingly.

Figure 3A:
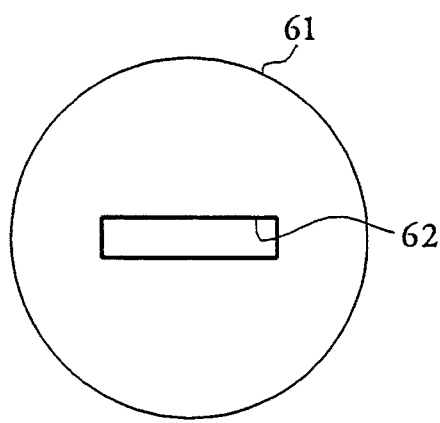
FIG. 3A is a top view of a silicon anode of the present invention.

FIG. 3A shows a top of a silicon slab 61 which may be of a similar thickness as the vacuum tube wall 18, the slab 61 serving as a support bonded to the end of the wall 18, not shown in this figure. The slab 61 has been cut with a laser, saw or other machining device to bore a rectangular hole 62 to allow electrons to pass through. The slab 61 may be made of doped silicon and may serve as an anode. The slab 61 is preferably anodically bonded to the glass wall 18 shown in FIG. 1.

Figure 3B:
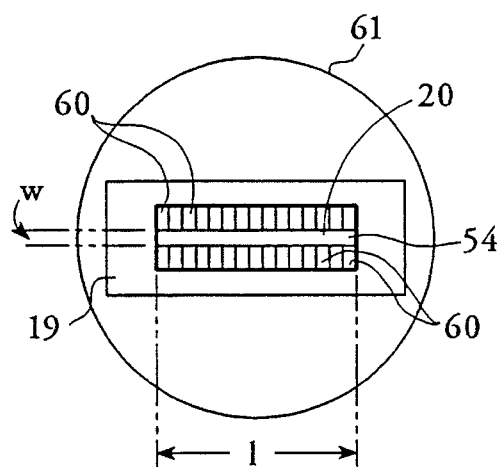
FIG. 3B is a top view of the anode of FIG. 3A onto which a substrate including microchannel cooling slots and a membrane is attached.

Referring now to FIG. 3B, the substrate 19 and membrane 20 are mounted atop the slab 61, again preferably by anodic bonding. For this purpose a thin film of silicon dioxide $SiO_2$ may be grown on either or both adjoining surfaces of the slab 61 and substrate 19. The membrane 20 has a smaller area as the hole 62, while the substrate 19 has a larger area than the hole 62, allowing the substrate 19 to support the membrane 20 while electrons travel through the hole 62 to impinge upon the membrane unperturbed by the slab 61.

The membrane 20 is stripe-shaped in order to allow a large area for electron transmission yet, by minimizing a width w of the membrane relative to its length 1, stresses of the membrane are lowered at points along that width, thereby averting failure of the vacuum chamber. Dispersed along both sides of the length 1 of the membrane are a series of microchannels 60 which can be used to direct fluid over the outer surface 54 of the membrane 20. The microchannels 60 are formed by anisotropic etching of the substrate 19 as is known in the art of semiconductor processing. The substrate 19 may be electrically grounded or may be connected to one or more ammeters.

Figure 4:
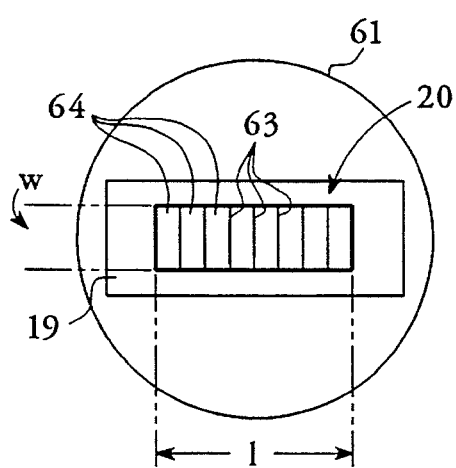
FIG. 4 is a top view of the device of FIG. 1 having a membrane with ridges separating recesses.

In FIG. 4, an alternative embodiment of a single crystal membrane 20 has a series of ridges or ribs 63 that traverse the membrane 20 for added strength, thereby allowing recesses 64 of the membrane 20 between the ribs 63 to be thinner. The series of ribs and recesses is formed by etching similar to the formation of microchannels. Along the length 1 of the membrane 20, the recesses 64 are five to ten times as wide as the ribs 63, allowing most electrons impinging upon the membrane 20 to pass through the recesses 64. As before, the substrate 19 is mounted atop the slab 61, although in this case the slab 61 has a larger hole to allow for the larger membrane 20. The recesses 64 may each have dimensions along the length 1 of the window of about several hundred μm and dimensions that span the width w that may be one to several mm. The ribs 63 each have dimensions along the width w similar to the recesses 64, and dimensions along the length 1 that may be one fifth to one tenth the dimensions of the recesses 64 along the length. The recesses 64 may have a thickness in a range between 0.5 μm and 5 μm in a direction orthogonal to the length 1 and width w.

Figure 5:
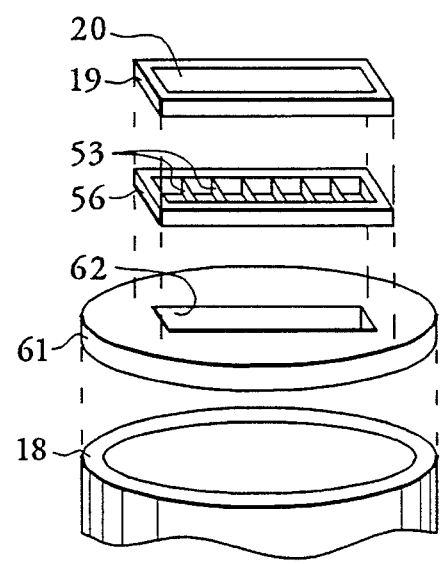
FIG. 5 is an exploded perspective view of a front end of an electron beam device formed from a separate anode, membrane and ribbed support for the membrane.

FIG. 5 shows an exploded view of an alternative embodiment in which an extra layer 56 of silicon or other compatible material is sandwiched between the slab 61 and the substrate 19 over the hole 62. The layer 56 has a series of ribs 53 that adjoin and support the thin, stripe-shaped membrane 20. Having the membrane 20, support ribs 53 and hole 62 in separate layers as shown in this embodiment allows for more efficient manufacture, as the separate layers can be independently sculpted with different devices and processes. Preferably the slab 61, the layer 56 and the substrate 19 are all made from silicon, and the wall is made from Pyrex glass, so that thermal coefficients of expansion of the different elements match at common operating temperatures and the electron beam device 15 can withstand a wide range of temperature variations.

Figure 6A:
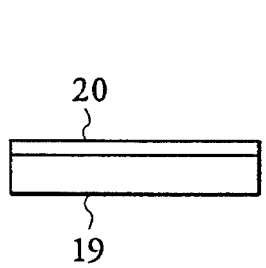
FIGS. 6A, 6B and 6C illustrate steps in the formation of a single crystal membrane and microchannels of FIG. 3B.
Figure 6B:
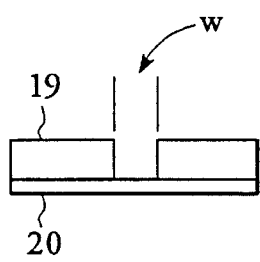
Figure 6C:
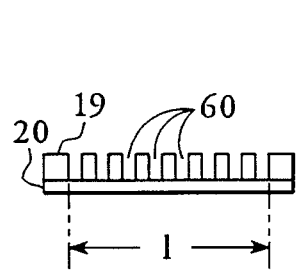

In FIGS. 6A–6C, a process that is used to form the membrane 20 of FIG. 3B is shown, beginning with FIG. 6A, which shows a crystalline substrate 19 onto which the membrane 20 is epitaxially grown. The crystal lattice of the substrate 19 determines the crystalline structure of the membrane 20. For that reason the crystal lattice of the material of the membrane should match that of the substrate, and while the substrate need not be a single crystal, a surface on which the membrane is grown must present a defect free crystalline pattern. Given such lattice matching and a defect free surface, defect free single crystals can be grown by low pressure chemical vapor deposition (LP-MOCVD), molecular beam epitaxy (MBE) or other techniques common to the art of semiconductor processing. In FIG. 6B, which is vertically inverted relative to FIG. 6A, the substrate 19 has been etched away across the width w of the membrane 20. In FIG. 6C, in which the substrate 19 and membrane 20 are oriented perpendicularly relative to FIG. 6B, an array of microchannels 60 can be seen to have been anisotropically etched into the substrate 19 along a length 1 of the membrane 20.

Alternatively, commercially available single crystal substrates 19 such as silicon can be anisotropically etched by amounts leaving a membrane 20 of desired dimensions, and if desired can be etched to create microchannels or other structures. In this embodiment, layer 20 in FIG. 6A also represents an etch stop layer in a doped wafer 19. Such an etch stop layer 20 can be formed by implanting ions of an opposite conductivity type in the layer 20 compared to the conductivity type of the wafer 19. This technique can also be used to provide tension or compression to a membrane. If, for example, the wafer 19 is primarily silicon but has been doped with arsenic ions for n-type conductivity, and the etch stop layer which will become the membrane 20 has been doped with boron for a p-type conductivity, the etch stop layer 20 of the crystal lattice will tend to have a smaller bond length than that of the n-type wafer 19, since boron has a smaller bond length than that of arsenic. This will provide tension to the membrane 20, as its bonds are stretched to conform to the bond length of the mechanically dominant wafer 19. On the other hand, if the membrane 20 is doped with arsenic and the wafer 19 is doped with boron, an opposite result will occur, with the membrane 20 held in compression by the wafer 19.

FIGS. 7A and 7B show an alternative electron window embodiment of the present invention in which a second, single crystal, electron permeable, gas impermeable membrane 65 and substrate 67 are aligned with membrane 20 and substrate 19. In FIG. 7A the second membrane 65 can be seen to be spaced apart from the first membrane 20, allowing cooling fluid to flow between the membranes 20 and 65. The membranes 20 and 65 are so thin and thermally conductive that cooling of a major surface rapidly cools an entire membrane. By passing a cooling fluid between the membranes 20 and 65, the fluid can be forced to pass closely to a major surface of each membrane, thereby enhancing cooling. FIG. 7B shows a cross sectional view of membranes 20 and 65 and substrates 19 and 67 of FIG. 7A, with walls of microchannels 60 aligned with those of microchannels 70 of substrate 67, providing support and allowing ingress and egress of the fluid to the space between the membranes 20 and 65.

The plenum formed between the membranes 20 and 65 can be maintained at a pressure between that within the vacuum tube 15 and an ambient pressure extant outside the vacuum tube 15. Due to this pressure matching technique, the membranes 20 and 65 can each be made thinner, as a pressure differential across each membrane is lowered, reducing the thickness of the membranes 20 and 65 needed to withstand the stress caused by these pressure differences.

Cooling of the membrane 20 or membranes 20 and 65 can be performed by a variety of methods. The microchannels 60 can be provided with fluid flowing at a high rate which is directed across the outer surface in a high velocity flow close to and parallel with that surface 54. In this fashion, a stagnant, generally non-thermally conductive layer which is common to laminar flow of fluid adjoining the outer surface and obstructing heat flow from that surface is not allowed to form. On the other hand, microchannels 60 disposed around the outer surface 54 can be maintained at a lower pressure than that adjacent the surface 54, sucking fluid away from the surface 54 and taking heat acquired by that fluid from the surface 54 away as well. Cooling fluid can be introduced to the outer surface 54 near its center, which is likely to be the part of the surface encountering the highest current density and the highest heating, thereby cooling the membrane uniformly as it travels outward toward the microchannels 60. The microchannels 60 can be used to supply a small amount of vaporizable liquid to the outer surface 54 so that a thin film of a liquid forms on the outer surface 54, particularly if the outer surface is oriented vertically above the inner surface 52. Thin films of liquid can have favorable heat exchange characteristics due to vaporization at a meniscus rather than within the film. It is important that the fluid supplied to the outer surface 54 for cooling does not leave a residue which hinders operation of the device 15. High purity inert gases can be used for cooling, as can high purity water, alcohol, or other non-viscous liquids. The cooling fluid can be supplied to the outer surface 54 at a higher pressure than that distal to the surface 54, so that additional cooling is performed by the fluid due to expansion of the fluid, in accordance with known laws of thermodynamics. Any of these cooling methods can be accomplished with known, commercially available fluid (gas or liquid) pumps connected in fluid communication with the various configurations described adjacent the outer surface 54.

Referring to FIG. 8, another embodiment of the present invention is shown having a pair of focus plates 78 and some windings of a magnetic coil 80, both of which can be used to control trajectories of electrons to better focus the electrons toward the membrane 20. Focus plates 78 are separated from cathode 25 and can be supplied through pins 82 and 83 with differential voltages as needed to focus the beam at the membrane 20. Application of a DC current to the coil 80 which has an axis generally coaxial with an imaginary line between the filament 22 and the membrane 20 will cause electrons accelerated toward the membrane 20 by the cathode 25 but angled away from that line to spiral around that line toward the membrane. Additionally, the magnetic field generated by a few windings of coil 80 will tend to be strongest within the coil 80 near the windings, and weaker near the imaginary line connecting filament 22 and membrane 20, thereby further focussing the electrons toward the membrane 20.

The membrane 20, which is typically bowed inward due to the greater pressure outside than within the vacuum tube device 15, can be seen in this embodiment to be bowed outward prior to evacuation of the device 15. Later, when air is evacuated from the device 15 the bowed membrane 20 is pulled flat strengthening the membrane 20. This "prebowing" can be accomplished, for example, by growing a thin layer of silicon dioxide $SiO_2$ on what is to become an inner surface of a single crystal silicon membrane 20 at an elevated temperature.

As the temperature is reduced from the elevated growing temperature the oxide layer, which has a higher coefficient of thermal expansion than silicon, shrinks more than the silicon, causing the membrane 20 to bow outward due to the compression of the silicon relative to the oxide layer. When the device 15 is thereafter brought to a vacuum, the silicon of the membrane 20 is further compressed as the membrane 20 flattens. The membrane is further compressed by a similar effect following anodic bonding of the layer including the membrane 20 to the glass wall 18, as the wall 18 shrinks more upon cooling than the membrane 20. The compressed membrane 20 is found to be stronger than a similar membrane that is stretched under tension, with the compressed membrane 20 less likely to develop a hole that propagates under tension. Other means for compressing the membrane include selecting the single crystal membrane 20 material to have a lower coefficient of thermal expansion than the wall 18 or substrate 19 to which the membrane is bonded at an elevated temperature, or implanting the membrane with dopants.

I claim:

1. An electron beam device comprising,
   a body formed from gas impermeable material and defining a chamber having an aperture disposed at one end,
   a crystalline substrate positioned on said body to cover said aperture, said crystalline substrate attached to said body forming a fluid-tight seal therewith, with said body forming a generally vacuous chamber, said crystalline substrate including a thin, electron permeable, gas impermeable, single crystal membrane, disposed adjacent to said aperture, said membrane having first and second opposed major surfaces,
   means, distally positioned with respect to said membrane, for generating electrons within said chamber,
   means, in electrical communication with said generating means, for accelerating said electrons toward said membrane.

2. The device of claim 1 wherein said means for accelerating said electrons toward said membrane includes a crystalline anode connected to said membrane.

3. The device of claim 2 further comprising means, connected to said anode, for monitoring a current of said electrons striking said anode.

4. The device of claim 2 wherein said anode is primarily silicon.

5. The device of claim 1 further comprising a crystalline layer affixed to said body pierced by an aperture traversed by at least one supporting structure adjoining said second major surface.

6. The device of claim 1 wherein at least one of said major surfaces includes a plurality of recessed areas defining at least one ridge separating said plurality of recessed areas.

7. The device of claim 1 wherein said membrane is compressed along at least one of said first and second major surfaces.

8. The device of claim 1 further comprising,
   a second electron permeable, gas impermeable, single crystal membrane spaced proximate to said second major surface, and
   a heat exchanging fluid disposed between said membranes.

9. The device of claim 8 wherein said fluid has a pressure that is greater than a pressure within said chamber and less than an ambient pressure outside said body, whereby said fluid reduces a differential pressure on said membranes compared to that between said chamber and said ambient pressure.

10. The device of claim 1 further comprising a fluid with a turbulent flow disposed adjacent to said second major surface, whereby heat from said membrane is quickly transported from said second major surface.

11. The device of claim 1 further comprising a fluid disposed adjacent to said second major surface having a boiling point at a temperature and a pressure common to said second major surface and below a melting point of said membrane, whereby said fluid changes from a liquid state to a gaseous state adjacent to said second major surface, thereby absorbing heat from said membrane.

12. The device of claim 11 wherein said fluid is disposed in fluid pulses that move across said second major surface and said electrons are disposed in electron pulses that travel through said membrane, said fluid pulses and said electron pulses passing said membrane at generally separate times.

13. The device of claim 1 wherein said single crystal is comprised essentially of type IV atomic species.

14. The device of claim 1 wherein said single crystal is comprised essentially of type III and type V atomic species.

15. The device of claim 1 further including a solid layer affixed to said body, defining an aperture adjacent to said second major surface, said solid layer having a plurality of microchannels in fluid communication with said aperture.

16. The device of claim 1 wherein said crystalline substrate and said membrane have substantially matching lattice constants.

17. The device of claim 16 wherein said crystalline substrate has a first lattice constant having a first value and said membrane has a second lattice constant having a second value, with said first and second values being within one tenth of one percent.

18. The device of claim 1 wherein said crystalline substrate and said membrane have matching coefficients of thermal expansion.

19. An electron beam device comprising,
   a gas impermeable body defining a generally vacuous chamber, said body including a thin, electron permeable, gas permeable, single crystal membrane, said membrane having first and second major surfaces, said first major surface adjoining said chamber,
   means, in electrical communication with said electrons, for generating electrons within said chamber,
   means, disposed within said chamber, for accelerating said electrons toward said membrane, and
   a solid layer affixed to said body and defining an aperture adjacent to said second major surface, said solid layer having a plurality of microchannels in fluid communication with said aperture.

20. The device of claim 19 further comprising a fluid flowing in said microchannels and past said second major surface.

21. The device of claim 19 wherein said crystalline substrate and said membrane have substantially matching lattice constants.

22. The device of claim 21 wherein said crystalline substrate and said membrane have matching coefficients of thermal expansion.

23. The device of claim 22 wherein said crystalline substrate has a first lattice constant of a first value and said membrane has a second lattice constant of a second value, with said first and second values being within one tenth of one percent.

24. An electron beam device comprising,
- a vacuum tube body having a front end and a back end, with a crystalline anode disposed near said front end, said crystalline anode including an electron permeable, gas impermeable crystalline membrane, said membrane having first and second major surfaces oriented transversely to said thickness, said first major surface facing said back end,
- means for generating electrons within said body near said back end, and
- an acceleration means, in electrical communication with said electrons, for accelerating said electrons toward said membrane, said accelerating means including an electrode, disposed distal to said front end, said electrode being adapted to maintain a cathode disposed distal to said membrane and held at an electrical potential more negative than said crystalline anode.

25. The device of claim 24 wherein said membrane and said anode are formed of substantially identical materials.

26. The device of claim 24 further comprising a support structure adjoining said anode including at least one support rib adjoining said first major surface.

27. The device of claim 24 wherein said membrane is compressed.

28. The device of claim 24 wherein said membrane is traversed with a plurality of support ribs.

29. The device of claim 24 further including a substrate positioned adjacent to said anode, with said substrate having a recessed portion forming an electron permeable, gas impermeable window, said window being positioned spaced-apart from said membrane defining an opening therebetween.

30. The device of claim 29 wherein said opening includes a plurality of partitions subdividing said opening to form a plurality of microchannels.

31. The device of claim 29 further comprising a plurality of microchannels defined by said substrate in fluid communication with said opening at ports disposed adjacent to said width of said membrane.

32. The device of claim 24 wherein said tube body is mostly made of glass and said membrane and said cathode are mostly made of silicon.

33. The device of claim 24 further comprising electronic means, connected to said front end, for monitoring a position of said electrons at said front end.

34. The device of claim 24 further comprising electronic means, connected to said front end, for monitoring a current of said electrons.

35. The device of claim 24 wherein said acceleration means includes a plurality of electrically charged plates and said generating means includes a filament, with said plates being disposed about a pathway between said filament and said membrane, whereby said plates direct said electrons generated by said filament toward said membrane.

36. The device of claim 24 wherein said acceleration means includes a coil carrying electrical current and having an axis aligned with a pathway between said means for generating electrons and said membrane, whereby a magnetic field is produced by said current in said coil that is aligned with said pathway and directs said electrons in spiral paths toward said membrane.

37. The device of claim 24 wherein said cathode is shaped as a cup, whereby said electrons are focussed toward said membrane.

* * * * *